(12) United States Patent
Sakabe et al.

(10) Patent No.: US 11,247,581 B2
(45) Date of Patent: Feb. 15, 2022

(54) BATTERY CONTROL DEVICE

(71) Applicant: VEHICLE ENERGY JAPAN, INC., Ibaraki (JP)

(72) Inventors: Kei Sakabe, Tokyo (JP); Keiichiro Ohkawa, Hitachinaka (JP); Takanori Yamazoe, Tokyo (JP); Ryohhei Nakao, Hitachinaka (JP); Masahiro Yonemoto, Tokyo (JP)

(73) Assignee: VEHICLE ENERGY JAPAN, INC., Ibaraki (JP)

( * ) Notice: Subject to any disclaimer, the term of this patent is extended or adjusted under 35 U.S.C. 154(b) by 15 days.

(21) Appl. No.: 16/876,802

(22) Filed: May 18, 2020

(65) Prior Publication Data

US 2020/0280204 A1   Sep. 3, 2020

Related U.S. Application Data (63) Continuation of application No. 15/738,994, filed as application No. PCT/JP2016/063128 on Apr. 27, 2016, now Pat. No. 10,680,453.

(30) Foreign Application Priority Data

Jul. 2, 2015  (JP) .............................. JP2015-133913

(51) Int. Cl.
  *B60L 58/10*    (2019.01)
  *G01R 31/389*   (2019.01)
  (Continued)

(52) U.S. Cl.
  CPC ............ *B60L 58/10* (2019.02); *B60L 3/0046* (2013.01); *B60L 58/12* (2019.02); *B60L 58/14* (2019.02);
  (Continued)

(58) Field of Classification Search
  CPC .......... B60L 58/10; B60L 58/12; B60L 58/14; B60L 58/22; G01R 31/392; G01R 31/389;
  (Continued)

(56) References Cited

U.S. PATENT DOCUMENTS 6,064,182 A    5/2000  Eguchi
7,209,841 B2   4/2007  Melichar
(Continued)

FOREIGN PATENT DOCUMENTS

JP    11-038107 A    2/1999
JP    2009-264962 A  11/2009
(Continued)

OTHER PUBLICATIONS

International Search Report for WO 2017/002440 A1, dated Aug. 16, 2016.
(Continued)

*Primary Examiner* — David V Henze-Gongola
*Assistant Examiner* — Tarikh Kanem Rankine
(74) *Attorney, Agent, or Firm* — Volpe Koenig (57) ABSTRACT

A battery control device capable of obtaining an allowable charge/discharge current value can further accurately reflect a polarization state of a battery. A battery controller includes a first allowable current value calculation unit, a battery equivalent circuit model, and a correction amount calculation unit. Assuming a non-polarization state, a current limit value of the battery based on an open circuit voltage and upper and lower limit voltages set in the battery, the first allowable current value calculation unit calculates a first allowable current value Imax1. The battery equivalent circuit model estimates a polarization state of the battery when the current limit value is being calculated. The correction unit calculates an allowable current value correction value (Continued)

based on the estimated polarization state for correcting Imax1. A second allowable current value Imax2 which is the corrected first allowable current value is output as an allowable charge/discharge current value of the battery.

8 Claims, 3 Drawing Sheets

(51) Int. Cl.
| | |
|---|---|
| *G01R 31/392* | (2019.01) |
| *H02J 7/00* | (2006.01) |
| *H01M 10/44* | (2006.01) |
| *B60L 58/22* | (2019.01) |
| *B60L 3/00* | (2019.01) |
| *B60L 58/16* | (2019.01) |
| *B60L 58/15* | (2019.01) |
| *B60L 58/12* | (2019.01) |
| *B60L 58/14* | (2019.01) |
| *B60W 20/13* | (2016.01) |
| *G01R 31/36* | (2020.01) |

(52) U.S. Cl.
CPC .............. *B60L 58/15* (2019.02); *B60L 58/16* (2019.02); *B60L 58/22* (2019.02); *B60W 20/13* (2016.01); *G01R 31/3648* (2013.01); *G01R 31/389* (2019.01); *G01R 31/392* (2019.01); *H01M 10/44* (2013.01); *H02J 7/00* (2013.01); *H02J 7/0068* (2013.01); *B60L 2240/545* (2013.01); *B60L 2240/547* (2013.01); *B60L 2240/549* (2013.01); *B60W 2510/246* (2013.01); *B60W 2710/248* (2013.01); *Y02T 10/70* (2013.01); *Y10S 903/903* (2013.01)

(58) Field of Classification Search
CPC ... Y02T 10/70; Y02T 10/705; Y02T 10/7072; H02J 7/0068; H01M 10/48; H01M 10/482; H01M 10/44
See application file for complete search history.

(56) References Cited

U.S. PATENT DOCUMENTS

| | | | | |
|---|---|---|---|---|
| 9,040,247 | B2* | 5/2015 | Adler | C07K 14/705 435/7.21 |
| 10,422,824 | B1* | 9/2019 | Plett | G01R 31/00 |
| 2002/0120906 | A1* | 8/2002 | Xia | H01M 8/04992 716/111 |
| 2003/0195719 | A1* | 10/2003 | Emori | B60L 50/16 702/183 |
| 2005/0119856 | A1* | 6/2005 | Emori | B60W 20/13 702/127 |
| 2006/0091863 | A1 | 5/2006 | Melichar | |
| 2006/0103348 | A1 | 5/2006 | Melichar | |
| 2006/0111854 | A1* | 5/2006 | Plett | G01R 31/367 702/63 |
| 2006/0202857 | A1* | 9/2006 | Kawahara | B60L 3/0038 340/870.02 |
| 2007/0080668 | A1* | 4/2007 | Al-Anbuky | H01M 10/121 320/136 |
| 2007/0145954 | A1 | 6/2007 | Kawahara | |
| 2007/0299620 | A1* | 12/2007 | Yun | G01R 31/3842 702/63 |
| 2008/0007224 | A1 | 1/2008 | Melichar | |
| 2008/0053715 | A1 | 3/2008 | Suzuki | |
| 2009/0271132 | A1 | 10/2009 | Furukawa et al. | |
| 2010/0030499 | A1* | 2/2010 | Kawahara | H02J 7/0049 702/63 |
| 2010/0085057 | A1* | 4/2010 | Nishi | G01R 31/3842 324/427 |
| 2011/0012563 | A1* | 1/2011 | Paryani | H02J 7/0021 320/162 |
| 2011/0109273 | A1 | 5/2011 | Tamezane | |
| 2011/0127958 | A1 | 6/2011 | Ishishita | |
| 2012/0171674 | A1* | 7/2012 | Adler | C12Q 1/6883 435/6.11 |
| 2012/0256569 | A1 | 10/2012 | Kawahara et al. | |
| 2013/0335034 | A1 | 12/2013 | Suzuki | |
| 2014/0111164 | A1 | 4/2014 | Ohkawa et al. | |
| 2014/0139189 | A1 | 5/2014 | Izumi | |
| 2014/0207318 | A1* | 7/2014 | Sisk | B60L 58/12 701/22 |
| 2015/0046108 | A1* | 2/2015 | Akamine | H01M 10/486 702/63 |
| 2015/0084639 | A1* | 3/2015 | Joe | B60L 58/12 324/428 |
| 2015/0112622 | A1* | 4/2015 | Uchino | G01R 19/0084 702/64 |
| 2015/0160301 | A1* | 6/2015 | Kusano | H02J 7/0071 84 320/134 |
| 2015/0298572 | A1* | 10/2015 | Sisk | H02J 7/1423 701/22 |
| 2016/0059727 | A1* | 3/2016 | Lee | H02J 7/0014 701/22 |
| 2016/0187429 | A1 | 6/2016 | Kawai | |
| 2016/0233693 | A1 | 8/2016 | Suzuki | |
| 2016/0245871 | A1* | 8/2016 | Joe | G01R 31/3842 |
| 2017/0038431 | A1* | 2/2017 | Wada | G01R 31/382 |
| 2017/0059662 | A1 | 3/2017 | Cha | |
| 2017/0141589 | A1 | 5/2017 | Inoue | |
| 2017/0176540 | A1* | 6/2017 | Omi | G01R 31/367 |

FOREIGN PATENT DOCUMENTS

| | | |
|---|---|---|
| JP | 2011-103748 A | 5/2011 |
| JP | 2014-236625 A | 12/2014 |
| JP | 2015-078918 A | 4/2015 |
| JP | 2015-114135 A | 6/2015 |
| WO | 2011/045853 A1 | 4/2011 |
| WO | 2012/169063 A1 | 12/2012 |
| WO | 2014027389 A1 | 2/2014 |

OTHER PUBLICATIONS

Extended European Search Report dated Jan. 31, 2019 for the European Patent Application 16817550.3.
Japanese Office Action dated Mar. 12, 2019 for the Japanese Patent Application No. 2018-147804.

* cited by examiner

BATTERY CONTROL DEVICE

CROSS REFERENCE TO RELATED APPLICATION(S)

This application is a continuation of U.S. patent application Ser. No. 15/738,994, filed Dec. 21, 2017, which claims priority to PCT Application PCT/JP2016/063128 filed on Apr. 27, 2016 which claims priority to JP Patent Application 2015-133913 filed on Jul. 2, 2015, both of which are incorporated by reference as if fully set forth.

TECHNICAL FIELD

The present invention relates to a battery control device of a battery system.

BACKGROUND ART

In recent years, battery systems incorporating a large number of batteries, such as power storage devices for moving objects, power storage devices for stabilizing grid interconnection, and emergency power storage devices, have attracted attention. To derive performance of these systems, parameters such as a battery charge rate (hereinafter referred to as SOC), a deterioration rate (SOH), a maximum chargeable/dischargeable current (allowable current value) are calculated and used for battery control, or it is necessary to properly equalize the charge rate of each battery.

To realize the above, a circuit (cell controller) for battery voltage measurement is attached to each battery, and based on information sent from these cell controllers, a battery controller mounting a central processing unit (CPU) performs the above-described calculation and operation. The calculation of the allowable current value is part of a safety function to prevent overvoltage of a battery, and safety of a battery system is maintained by limiting a current so as not to exceed the allowable current value.

To calculate the maximum current at which the battery does not become overvoltage, the internal state and parameters of the battery such as an open current voltage (hereinafter referred to as OCV) of the battery and internal resistance information. In particular, it is necessary to influence a polarization voltage generated in the battery in a power storage device for a moving object in which irregular current always flows. Considering calculation performance of the above-described CPU, it is particularly required to calculate a safe current in consideration of influence of an OCV, an internal resistance, and a polarization voltage in calculation of allowable current value for a moving object with a small calculation amount. However, to calculate the polarization voltage, it is necessary to use a function having a large calculation amount such as an exponential function and therefore difficult to calculate with the CPU.

Therefore, a method has been proposed in which a time during which a current continuously flows in a battery is measured, and a resistance value to be used for calculation of an allowable current value is referred to from a resistance value table reflecting the influence of a polarization voltage by using the measured time (for example, refer to PTL 1). According to this, the allowable current value can be calculated with a small calculation amount without using an exponential function or the like. Further, as disclosed in PTL 1, a method is used in which a fixed resistance value corresponding to a sufficiently large polarization voltage is used for applications in which a current continuously flows for a short time as in a hybrid vehicle. Through these methods, it is possible to calculate, with a small calculation amount, a current which does not cause a battery to become overvoltage even when a polarization voltage exists.

CITATION LIST

Patent Literature

PTL 1: WO 2012/169063 A

SUMMARY OF INVENTION

Technical Problem

Meanwhile, in the invention described in PTL 1, to reflect the influence of a polarization voltage on an allowable current value calculation, a resistance value in the case where a current continuously flows for a certain period of time is used. However, in reality, a charging period, a discharging period, and a pausing period may be switched in a time shorter than the assumed certain time, and the actual resistance value tends to be smaller than the assumed resistance value. Therefore, an allowable current value may be excessively limited in some cases.

Solution to Problem

A battery control device according to the present invention includes a current limit value calculation unit, an estimation unit, and a correction unit. The current limit value calculation unit calculates a current limit value of a battery assuming a non-polarization state, based on an open circuit voltage of the battery and upper and lower limit voltages set in the battery. The estimation unit estimates a polarization state of the battery at the time of calculating the current limit value. The correction unit corrects the current limit value based on the estimated polarization state. The battery control device outputs the current limit value corrected by the correction unit as an allowable charge/discharge current value of the battery.

Advantageous Effects of Invention

According to the present invention, it is possible to obtain an allowable charge/discharge current value further accurately reflecting a polarization state of a battery.

DESCRIPTION OF EMBODIMENTS

Figure 1:
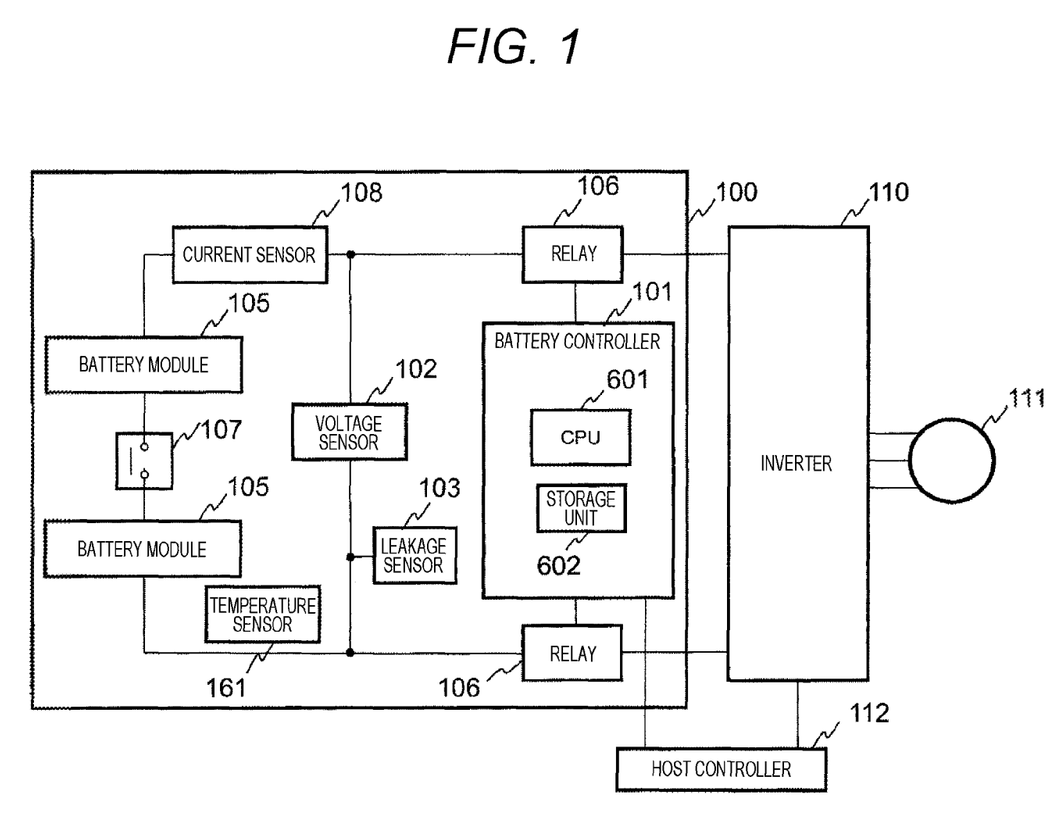
FIG. 1 is a diagram illustrating an embodiment of a battery system.

Embodiments of the present invention will be described below with reference to drawings. FIG. 1 is a diagram illustrating an embodiment of a battery system 100 and indicates an example of a battery system used for a battery power supply device. An output voltage of the battery system 100 is a direct current voltage which varies depending on a remaining capacity and an output current of a battery and therefore may not be suitable for directly supplying electric power to a load 111. Therefore, in the example indicated in FIG. 1, an inverter 110 converts the output voltage of the battery system 100 into three-phase alternating current and supplies the current to the load 111. A host controller 112 that controls the inverter 110 and the entire power converter controls.

The same configuration is applied in the case where a direct current voltage, another polyphase alternating current, or a single-phase alternating current is supplied to the load. In addition, when the load 111 outputs electric power, it is possible to store the electric power output by the load 111 in the battery module 105 by using the inverter 110 as a bidirectional inverter. Further, the battery module 105 can be charged as necessary by connecting a charging system to the battery system 100 in parallel with the inverter 110.

The battery system 100 transmits, to the host controller 112, a charging rate (SOC) and a deterioration rate (SOH) of a battery useful for controlling the inverter 110 and the load 111, a maximum charge/discharge current (allowable current value) which can flow into the battery, a battery temperature, information on a battery state such as the presence or absence of abnormality of the battery. The host controller 112 performs such as energy management and abnormality detection on the basis of these pieces of information. Further, the host controller 112 transmits a disconnection instruction to the battery system 100 when the host controller 112 determines that the battery system 100 should be disconnected from the inverter 110 or the load 111.

The battery system 100 includes a battery module 105, a battery controller 101, a relay 106, a current sensor 108, a voltage sensor 102, a leakage sensor 103, a circuit breaker 107, and a temperature sensor 161. At least one battery module 105 which includes a plurality of batteries is included. The battery controller 101 monitors, estimates, and controls a state of the battery system 100. The relay 106 intermits output of the battery system 100. The current sensor 108 measures a current flowing into a battery. The voltage sensor 102 measures a battery voltage. The leakage sensor 103 measures an insulation resistance between the battery system 100 and, for example, the ground. The circuit breaker 107 is provided in response to an output voltage of the battery system 100. The temperature sensor 161 measures a battery temperature. The battery controller 101 includes a CPU 601 and a storage unit 602. The CPU 601 performs various calculations. The storage unit 602 stores battery parameters to be described later. The battery system 100 illustrated in FIG. 1 includes two battery modules 105 connected in series via the circuit breaker 107.

The battery module 105 has a plurality of unit cells and has a circuit for measuring a temperature inside the module and a voltage of each unit cell, and a circuit for performing charge and discharge for each unit cell as needed. This makes it possible to perform voltage monitoring and voltage adjustment for each unit cell and to measure temperature information necessary for estimating a battery state in which characteristics change according to a temperature. Details will be described later.

The current sensor 108 and a pair of the relays 106 are connected in series to the battery modules 105 connected in series. The current sensor 108 measures a current value necessary for monitoring/estimating a state of the battery module 105. By controlling opening and closing of a pair of the relays 106 based on an instruction of the host controller, it is possible to shut off or connect output of the battery system 100. In the case where a voltage of the battery module 105 is high, for example, 100 V or more, the circuit breaker 107 may be added to manually shut off power input/output to the battery system 100. By forcibly shutting off the input/output by using the circuit breaker 107, it is possible to prevent occurrence of an electric shock accident or a short-circuit accident at the time of assembling or disassembling the battery system 100 or when handling an accident of a device mounting the battery system 100.

In the case where a plurality of the battery modules 105 are connected in parallel, the relay 106, the circuit breaker 107, and the current sensor 108 may be provided in each row, or the relay 106, the circuit breaker 107, and the current sensor 108 may be provided only in an output portion of the battery system 100. In addition, the relay 106, the circuit breaker 107, and the current sensor 108 may be provided both in each row and the output portion of the battery system 100.

The relay 106 may be formed of one relay or formed of a combination of a main relay, a precharge relay, and a resistor. In the latter configuration, the resistor is placed in series with the precharge relay, and these are connected in parallel with the main relay. Then, when the relay 106 is connected, first the precharge relay is connected. Since the current flowing through the precharge relay is limited by the resistor connected in series. Therefore, an inrush current which can occur in the former configuration can be limited. Then, after the current flowing through the precharge relay becomes sufficiently small, the main relay is connected. The timing of connecting the main relay may be based on the current flowing through the precharge relay or may be based on a voltage applied to the resistor or a voltage between terminals of the main relay. Further, the timing may be based on the time elapsed since the precharge relay is connected.

The voltage sensor 102 measures a voltage value necessary for monitoring and estimating a state of the battery module 105. The voltage sensor 102 is connected in parallel to one or a plurality of battery modules 105 or connected in parallel to each series of the battery modules 105. In addition, the leakage sensor 103 is connected to the battery module 105, and a state in which electric leakage can occur, that is, a state in which an insulation resistance is lowered, can be detected before electric leakage occurs. As a result, occurrence of an accident can be prevented.

Measurement values by the battery module 105, the current sensor 108, the voltage sensor 102, and the leakage sensor 103 are transmitted to the battery controller 101. The battery controller 101 monitors and estimates a battery state and controls the battery system 100, based on the received measurement values. Here, the control means, for example, charging and discharging for each unit cell for equalizing a voltage of each unit cell, power source control of each sensor, addressing of the sensor, and control of the relay 106 connected to the battery controller 101. The CPU 601 performs calculations necessary for monitoring, estimating and controlling the battery state.

The battery system 100 may include a system cooling fan, and the battery controller 101 may control the fan. Since the battery system 100 performs cooling in this manner, the amount of communication with the host controller can be reduced.

In the example illustrated in FIG. 1, although the voltage sensor 102 and the leakage sensor 103 are made to be separate parts from the battery controller 101 to have a degree of freedom in configuration, the battery controller 101 may have a configuration in which the voltage sensor 102 and the leakage sensor 103 are incorporated in the battery controller 101. By adopting the incorporation configuration, the number of harnesses is reduced as compared with the case of preparing individual sensors, and the labor of attaching the sensor can also be reduced. However, by incorporating the sensor, the scale (maximum output voltage, current, etc.) of the battery system 100 in which the battery controller 101 can control may be limited. In such a case, the sensors are preferably separate parts.

Figure 2:
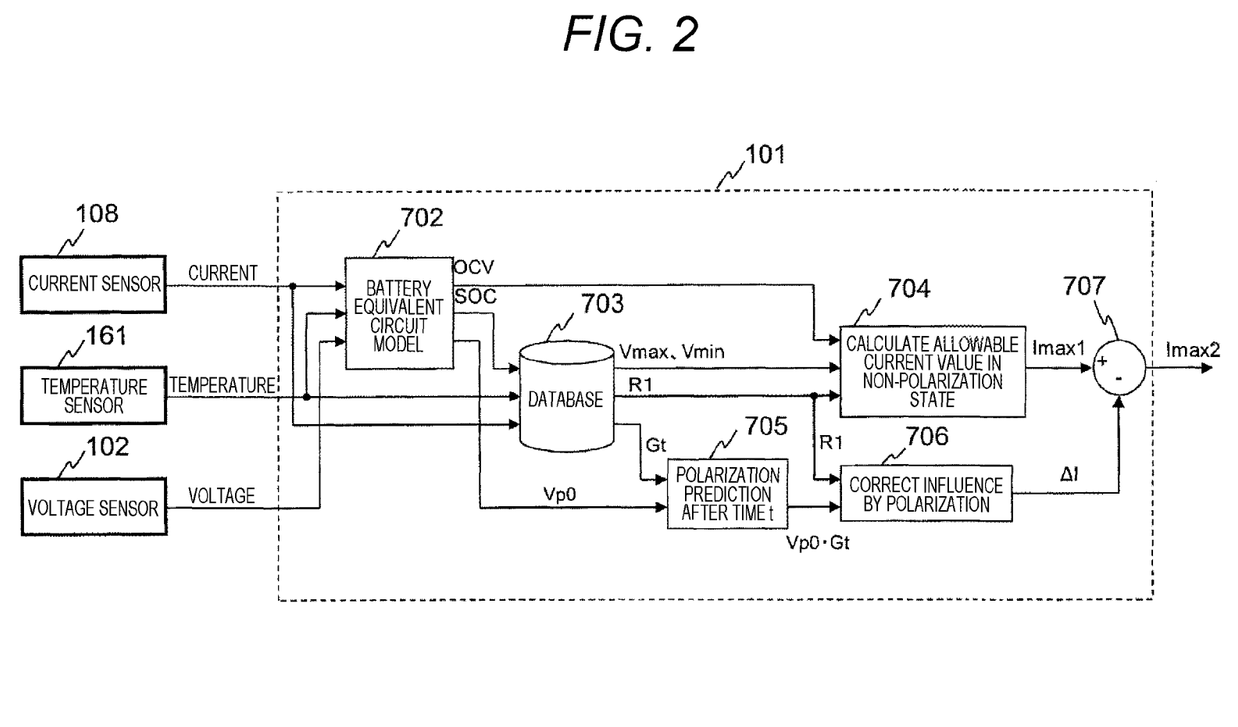
FIG. 2 is a block diagram describing a configuration for calculating an allowable current value.

FIG. 2 is a block diagram describing a configuration for calculating an allowable current value. The allowable current value calculation is performed by the CPU 601. As a functional configuration, the CPU 601 includes a battery equivalent circuit model 702, a first allowable current value calculation unit 704, a polarization prediction unit 705, a correction amount calculation unit 706, and a second allowable current value calculation unit 707. A database 703 is a battery parameter stored in the storage unit 602.

The battery equivalent circuit model 702 is an equivalent circuit model for expressing the internal state of a unit cell. The first allowable current value calculation unit 704 calculates a first allowable current value when there is no polarization in a battery. The polarization prediction unit 705 predicts polarization of a battery after a certain period of time. The correction amount calculation unit 706 calculates the influence of a polarization on the first allowable current value calculated by the first allowable current value calculation unit 704 as a correction value (allowable current value correction value). The second allowable current value calculation unit 707 corrects the allowable current value calculated by the first allowable current value calculation unit 704 with the allowable current value correction value calculated by the correction amount calculation unit 706 and outputs the corrected value as the second allowable current value.

The battery equivalent circuit model 702 estimates and outputs an SOC, an OCV, and a polarization voltage of a unit cell based on a current value measured by the current sensor 108, a battery temperature measured by the temperature sensor 161, and a battery closed circuit voltage (hereinafter referred to as a CCV) measured by the voltage sensor 102. As the CCV, a CCV converted from a voltage value measured by the voltage sensor 102 per unit cell or a CCV for each unit cell can be used. By using such the battery equivalent circuit model 702, the internal state of a unit cell which cannot be observed directly can be estimated, and the estimated value can be used for other processing.

Figure 3:
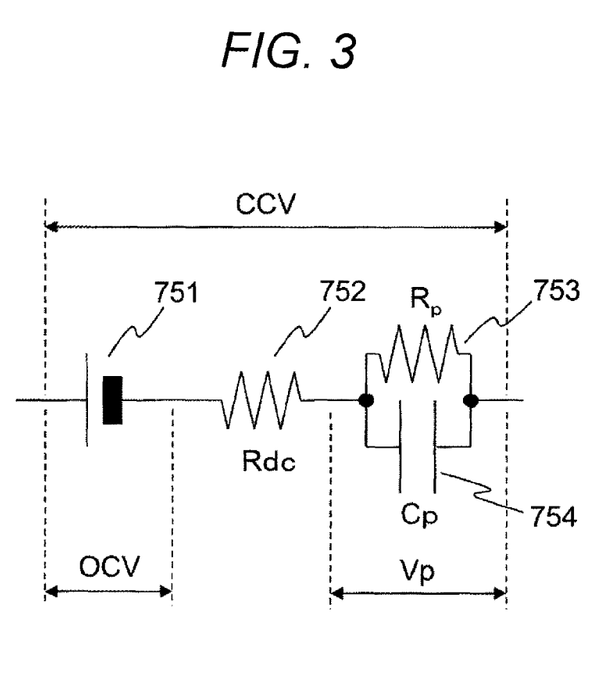
FIG. 3 is a diagram illustrating an example of a battery equivalent circuit model.

FIG. 3 is a diagram illustrating an example of the battery equivalent circuit model 702. In the example illustrated in FIG. 3, an OCV is denoted by a voltage source 751, a DC resistance is denoted by a resistor 752, a polarization resistance is denoted by a resistor 753, and a polarization capacity is denoted by a capacitor 754. These values change with deterioration of a battery, and therefore values according to deterioration are used. By applying an initial voltage to the battery equivalent circuit model 702 as the OCV, a polarization is initialized to a zero state. By continuously applying a current value measured by the current sensor 108 to the battery equivalent circuit model 702, the battery equivalent circuit model 702 can express the current battery state. Consequently, a polarization voltage can be calculated.

For example, a correlation table between an SOC and an OCV is stored in advance, and an initial value of the SOC is obtained from this correlation table and the OCV fetched as the initial voltage. During operation, for example, the SOC is estimated from the initial value thereof and the integrated current value. From the estimated SOC and the correlation table, it is possible to estimate the OCV in operation.

In the example illustrated in FIG. 3, a term of the polarization is assumed to be one. However, by using a plurality of terms, the calculation can be made more accurate. In initialization, the initial value of an electric charge accumulated in the capacitor 754 is set to zero. This is because there is a pause time generally sufficiently longer than a time constant of a battery before a system is started, and the capacitor 754 is completely discharged. The initialization is performed at the timing when the relay 106 is open, such as when the battery system 100 is activated or when an initialization command value is received from the host controller 112.

Returning to FIG. 2, the database 703 outputs upper and lower limit voltages needed for calculation of an allowable current value, and a first resistance and a first gain to be described later, based on the SOC output from the battery equivalent circuit model 702, the temperature output from the temperature sensor 161, and the current output from the current sensor 108. The OCV, the SOC, and the polarization voltage output from the battery equivalent circuit model 702 correspond to the present battery state. Therefore, the upper and lower limit voltages, the first resistance, and the first gain output from the database 703 also correspond to the present battery state. By using these output values, the allowable current value can be calculated according to the battery state.

In this manner, by obtaining output data values based on a map, it is possible to reduce the amount of calculation and to deal with characteristics whose theoretical expression is unknown. Further, the values may be output by an approximation expression. As a result, the amount of data can be reduced, and the accuracy of output values can be improved.

The first allowable current value calculation unit 704 calculates the first allowable current value Imax1 based on the OCV output by the battery equivalent circuit model 702, the upper and lower limit voltages output by the database 703, and the first resistance. The formula (1) indicates an example of a calculation formula of the allowable charge current Icmax1.

$$Icmax1 = (Vmax - OCV)/R1 \tag{1}$$

In the formula (1), Vmax indicates an upper limit voltage, and R1 indicates a first resistance. Here, the first resistance R1 is a resistance value (internal resistance) of a battery estimated after a constant current has flowed for a predetermined time, assuming that the constant current flows from an initialized non-polarization state. In the present embodiment, a value of the first resistance R1 is obtained in advance by such as an experiment and a simulation, and the value is stored in the database 703.

The internal resistance of a battery at the time of calculation (present) is an internal resistance in the state in which a polarization is zero, and therefore it is smaller than the first resistance R1. That is, the allowable charge current Icmax1 calculated by the formula (1) is smaller than the allowable charge current (allowable charge current calculated by substituting the present internal resistance into the formula (1)) according to the present battery state. Then, in the case where a constant current continues to flow from the non-polarization state, when a predetermined time has elapsed, the calculated allowable charge current reaches Icmax1.

The allowable discharge current Idmax1 is considered in the same manner as in the case of the allowable charge current Icmax1 and is calculated by the following formula (2). Vmin indicates a lower limit voltage. In the formula (2), the internal resistance after a lapse of a predetermined time is set to be the same first resistance R1 as in the case of charging. However, in an actual battery, the values are different between a charging direction and a discharging direction, and it is preferable to use a value corresponding to a current direction.

$$Id\max = (OCV - V\min)/R1 \tag{2}$$

In this manner, by controlling the charge/discharge current by the allowable current value (allowable charge current value, and allowable discharge current value) Imax1 calculated by using the first resistance R1, as long as the maximum current is continuously used within this range, a CCV does not reach the upper and lower limit voltages until the lapse of a predetermined time.

The first allowable current value Imax1 calculated by the first allowable current value calculation unit 704 is an allowable current value in the case where it is assumed that the current battery is in a non-polarization state. Therefore, when the present time is a time point after the lapse of a period of time from the initialization timing, the battery is not in a non-polarization state at the present time, and therefore an error occurs. Therefore, the following correction processing is performed by providing the polarization prediction unit 705, the correction amount calculation unit 706, and the second allowable current value calculation unit 07 such that an accurate allowable current value can be obtained even when a battery is not in a non-polarization state at the present time.

Further, in the above-described first allowable current value calculation unit 704, the first allowable current value Imax1 is calculated by using the first resistance R1 when a constant current flows for a predetermined time. In general, the following formula (3) using an exponential function needs to be used to predict a polarization voltage after a predetermined time when a constant current flows. Here, Vpt indicates a polarization voltage after a predetermined time, Rp indicates a polarization resistance, I indicates a current, Vp0 indicates a polarization voltage as at the present time, Cp indicates a polarization capacity, and t indicates a predetermined time.

$$Vpt = IRp - (IRp - Vp0)\exp(-t/RpCp) \tag{3}$$

When the right side of the formula (3) is divided into a term not including the polarization voltage Vp0 and a term including the polarization voltage Vp0, the following formula (4) is obtained. In this case, Gt=exp (−t/RpCp). In the formula (4), when I=0, Vpt=Vp0·Gt. When a current flowing in a battery is zero, a polarization voltage decreases with the lapse of time. Then, the polarization voltage of the value Vp0 decreases with the lapse of time and becomes Vpt=Vp0·Gt when the predetermined time t passes. As described above, the first gain Gt is a parameter expressing a temporal change (attenuation) in a polarization voltage and is a constant determined by the magnitude of the predetermined time t.

$$Vpt = IRp(1 - Gt) + Vp0 \cdot Gt \tag{4}$$

The relationship among the OCV, the CCV, and the Rdc in FIG. 3 is expressed by using the formula (4), as indicated in the following formula (5). I indicates a current flowing through a battery.

$$\begin{aligned} CCV &= OCV + I \cdot Rdc + Vpt \\ &= OCV + I \cdot Rdc + IRp(1 - Gt) + Vp0 \cdot Gt \\ &= OCV + I(Rdc + Rp(1 - Gt)) + Vp0 \cdot Gt \end{aligned} \tag{5}$$

The first allowable current value Icmax1 calculated by the first allowable current value calculation unit 704 is considered to be Vp0=0 in the formula (5) and corresponds to the case where the portion of "Rdc+Rp (1−Gt)" of the second term is regarded as the first resistance R1. Then, the third term of the formula (5)=Vp0·Gt is a voltage dependent on the polarization voltage Vp0 at the present point in time and is calculated by the polarization prediction unit 705. In the present embodiment, Gt is referred to as a first gain, and the third term=Vp0·Gt is referred to as a first polarization voltage. The polarization voltage Vp0 is calculated by the battery equivalent circuit model 702, and the first gain Gt is output from the database 703.

That is, the polarization prediction unit 705 calculates a first polarization voltage (Vp0·Gt) which is a polarization voltage after the lapse of the predetermined time t, based on the polarization voltage Vp0 at the present time output from the battery equivalent circuit model 702 and the first gain Gt output from the database 703. When a battery with the polarization voltage Vp0 is left in a zero current state, the polarization voltage gradually decreases. However, the polarization voltage after the lapse of the predetermined time t is the first polarization voltage (Vp0·Gt).

In this manner, by outputting the first gain Gt expressed by an exponential function from the database 703, an exponential function with a large calculation amount can be made unnecessary, and even in an embedded CPU which is restricted in a calculation capability, a polarization voltage after the lapse of a certain period of time can be easily calculated.

The correction amount calculation unit 706 calculates the influence of a polarization on the first allowable current value Imax1 calculated by the first allowable current value calculation unit 704 as an allowable current value correction value ΔI. As described above, the first allowable current value Imax1 is a current value in the case where Vp0=0 in the formula (5). Therefore, the allowable current value in the case of Vp0≠0 (that is, the allowable current value obtained after correction) is smaller than the first allowable current value Imax1 by the allowable current value correction value ΔI. Here, the allowable current value obtained after correction is referred to as a second allowable current value Imax2.

By substituting CCV=Vmax and I=Icmax2 in the formula (5), the following formula (6) is obtained. That is, the allowable current value correction value ΔI is calculated as ΔI=Vp0·Gt/R1.

$$Icmax2 = (V\max - OCV)/(Rdc + Rp(1-Gt)) - Vp0 \cdot Gt/ \\ (Rdc + Rp(1-Gt)) = (V\max - OCV)/R1 - Vp0 \cdot Gt/R1 \tag{6}$$

The second allowable current value calculation unit 707 subtracts the allowable current value correction value ΔI calculated by the correction amount calculation unit 706 from the first allowable current value Imax1 calculated by the first allowable current value calculation unit 704 and outputs the second allowable current value Imax2 expressed by the formula (6).

In this manner, in the present embodiment, the first allowable current value calculated on the assumption that a polarization as at the present time is in a non-polarization state is corrected with the allowable current value correction value ΔI calculated based on the polarization voltage Vp0 at the present point in time, and a current during charge and discharge is controlled by using the corrected second allowable current value Imax2. Since the second allowable current value Imax2 is calculated according to the polarization state of a battery, it is possible to further precisely calculate the largest current (that is, the allowable current value) at which a CCV does not reach the upper and lower limit voltages even if a current continues to flow for a predetermined time. In the above description, the predetermined time t is described in the case of t☐0 as an example. However, it can also be applied in the case of t=0.

Conventionally, when an allowable charge/discharge current in the battery state as at the present time is calculated, it is necessary to accurately know an internal resistance as at the present time. For example, when the allowable charge current is calculated in the battery state as at the present time, it can be calculated by using the internal resistance as at the present time instead of the first resistance in the formula (1). Although the internal resistance depends on the polarization state of a battery, in the technique described in the above-described PTL 1, instead of estimating the polarization state as at the present time, the internal resistance of the battery after a constant current has flowed for a certain time is used.

For example, in a battery system mounted in a hybrid vehicle, a current is charged and discharged at intervals of about several seconds to ten seconds. Therefore, for example, the internal resistance when a current (for example, 200 A) capable of being output by a battery flows for about 3 to 5 seconds is used. Therefore, a smaller allowable charge current is calculated than the allowable charge current on the basis of a battery state at the time of calculation. That is, the charge current is limited more than necessary.

In conventional techniques, the value of allowable current which can flow in "this moment" is calculated. However, from the viewpoint of energy management or the like, it is recently requested to calculate a value of allowable current which can continuously flow for "a certain period of time from now". As in a conventional manner, the value of allowable current which can flow in "this moment" is calculated. Therefore, when control is performed based on the allowable current value, a constant current may not continuously flow within an allowable current value range "from now to a predetermined time". On the other hand, in the present embodiment, an allowable current which can continuously flow for a predetermined time from the present time can be calculated. Therefore, it is possible to certainly perform control until the predetermined time with a current within the allowable current value range.

The predetermined time in the present embodiment is set according to the use environment of the battery system 100. For example, in the case where the system is used in a hybrid vehicle, the predetermined time is approximately set to the time during which charge and discharge predicted in a general vehicle use situation can be continued. The constant current value is also set in consideration of the current value required according to the general vehicle use situation. The set values regarding the predetermined time and the constant current are input from the host controller 112 illustrated in FIG. 1.

Further, the correction amount calculation unit 706 calculates influence of a polarization voltage on an allowable current value. In the example indicated in FIG. 2, the correction amount calculation unit 706 calculates the allowable current value correction value ΔI by using, as polarization information, the first polarization voltage Vp0·Gt when the predetermined time t has elapsed. Therefore it is possible to calculate a value of allowable current (the second allowable current value Imax2) which can certainly continue to flow for the certain time.

Although it is different from the processing indicated in FIG. 2, as polarization information, instead of the first polarization voltage Vp0·Gt, the polarization voltage Vp0 output from the battery equivalent circuit model 702 is input to the correction amount calculation unit 706, and the allowable current value correction value ΔI may be calculated as ΔI=Vp0/R1. This corresponds to using the first gain when Gt(0)=1, that is, t=0. Since the first gain Gt is Gt=exp(-t/RpCp), the gain is the largest when t=0 and decreases with the lapse of time. Therefore, when the polarization voltage Vp0 is used as the polarization information, the polarization voltage is estimated to be large. Therefore, although the allowable current value decreases, safety can be further certainly assured.

By using the polarization voltage multiplied by a fixed value, influence of the polarization voltage can be adjusted, and overvoltage due to a polarization voltage estimation error of the battery equivalent circuit model 702 can be prevented.

In the above-described embodiment, a value of the first resistance R1 corresponding to the internal resistance of a battery is stored in the database 703. However, from the DC resistance Rdc of the battery, an OCV change rate Gsoc per unit current (hereinafter called a second gain), the polarization resistance Rp, and the first gain Gt, the first resistance R1 may be obtained by calculation as the formula (7). By indirectly calculating the first resistance R1 in this manner, it is possible to handle parameter changes due to such as deterioration of a battery. Although the description of the second gain Gsoc, which is the OCV change rate per unit current, is omitted in the above-described formula (5), to express the first resistance R1 further accurately, the second gain Gsoc is preferably considered as the formula (7).

$$R1 = Rdc + Gsoc + Rp(1-Gt) \quad (7)$$

In the above-described embodiment, the following operational effects can be obtained. (a) The battery controller 101 which is a battery control device includes the first allowable current value calculation unit 704, the battery equivalent circuit model 702, the polarization prediction unit 705, the correction amount calculation unit 706, and the second allowable current value calculation unit 707. The first allowable current value calculation unit 704 calculates a first allowable current value which is a current limit value of a battery assuming a non-polarization state based on an open circuit voltage (OCV) of the battery and upper and lower limit voltages (Vmax and Vmin) set in the battery. The battery equivalent circuit model 702 estimates a polarization state of the battery at the time of calculating the current limit value. The polarization prediction unit 705 operates as a correction unit to correct the first allowable current value based on the estimated polarization state. Then, the corrected first allowable current value, that is, the second allowable current value Imax2, is output as an allowable charge/discharge current value of a battery.

The first allowable current value calculated on the assumption that a polarization as at the present time is in a non-polarization state is corrected by the allowable current value correction value ΔI calculated based on the polarization voltage Vp0 as at the present time. Therefore, an accurate allowable current value according to a battery state can be calculated.

(b) Further, the first allowable current value calculation unit 704 calculates the first allowable current value of a battery based on the open circuit voltage (OCV) of the battery, the upper and lower limit voltages (Vmax, Vmin) set in the battery, and the first resistance R1 which is a battery internal resistance in the case where a constant current flows in the battery from a non-polarization state for a predetermined time. The polarization prediction unit 705 calculates the first polarization voltage Vp0·Gt at the time when a battery in a polarization state estimated by the battery equivalent circuit model 702 is maintained in a current zero state for the predetermined time, and the first allowable current value may be corrected by using the allowable current value correction value ΔI corresponding to the calculated first polarization voltage Vp0·Gt.

As a result, it is possible to calculate an allowable current value (allowable charge/discharge current value) whereby constant current continuously flows for a predetermined period of time from the present time and perform control at a current within the allowable current value range until the predetermined time. Incidentally, the allowable current value correction value ΔI may be calculated as ΔI=Vp0·Gt/R1 by using the first resistance R1 which is a battery internal resistance and the first polarization voltage Vp0·Gt.

(c) Further, the first resistance R1 which is a battery internal resistance may be calculated by the above-described formula (7), based on the DC resistance Rdc of a battery, the second gain Gsoc which is an open circuit voltage change amount per unit current of the battery, and the polarization resistance Rp of the battery. Calculating the first resistance R1 in this manner makes it possible to deal with parameter changes due to deterioration of a battery or the like.

(d) In addition, at least one of the first resistance R1 which is a battery internal resistance, the first gain Gt which is a coefficient indicating a temporal change in a polarization voltage when a battery current is zero, and upper and lower limit voltages may be set to a value according to at least one of a temperature of a battery, a charging rate (SOC) of the battery, and a current flowing in the battery.

Although various embodiments and modifications have been described above, the present invention is not limited to these contents. Other embodiments considered within technical ideas of the present invention are also included within the scope of the present invention.

REFERENCE SIGNS LIST 100 battery system
101 battery controller
102 voltage sensor
105 battery module
108 current sensor
161 temperature sensor
601 CPU
602 storage unit
702 battery equivalent circuit model
703 database
704 first allowable current value calculation unit
705 polarization prediction unit
706 correction amount calculation unit
707 second allowable current value calculation unit
Imax1 first allowable current value
Imax2 second allowable current value
Gsoc OCV change rate (second gain)
Gt first gain
R1 first resistance
Vmax upper limit voltage
Vmin lower limit voltage
Vp0 polarization voltage
Vp0·Gt first polarization voltage
ΔI allowable current value correction value

The invention claimed is:

1. A battery control device comprising:
a memory;
an input/output device; and
a processor communicatively coupled to the memory and the input/output device, wherein the processor is configured to calculate a present polarization voltage of a battery by using each information of a current value, a voltage value, and a temperature of the battery;
store, via the memory, a parameter representing a temporal change in a polarization voltage; and
calculate an allowable current value at a resistance value after a constant current flows for a predetermined amount of time, such that the constant current flows from an initialized non-polarization state,
calculate a maximum current value based on a corrected value of the allowable current value on the basis of a product of the parameter representing the temporal change in the polarization voltage and the present polarization voltage,
calculate a second allowable current value based on a difference between the allowable current value and the maximum current value, and
control the battery such that the second allowable current value is output for a predetermined time.

2. The battery control device according to claim 1, wherein the memory stores a battery internal resistance predicted after causing a constant current to flow from a non-polarization state for a predetermined time.

3. The battery control device according to claim 2, wherein the processor calculates a polarization voltage after elapse of a predetermined time on the basis of the present polarization voltage and the parameter representing the temporal change of the polarization voltage.

4. The battery control device according to claim 3, wherein the processor calculates the corrected value of the allowable current value on the basis of the polarization voltage after elapse of the predetermined time and the battery internal resistance predicted after causing the constant current to flow from the non-polarization state for the predetermined time.

5. A battery pack comprising:
a battery;
a memory;
an input/output device; and
a processor communicatively coupled to the battery, the memory and the input/output device, wherein the processor is configured to
calculate a present polarization voltage of the battery by using each information of a current value, a voltage value, and a temperature of the battery;
store, via the memory, a parameter representing a temporal change in a polarization voltage;
calculate an allowable current value at a resistance value after a constant current flows for a predetermined amount of time, such that the constant current flows from an initialized non-polarization state;
calculate a maximum current value based on a corrected value of the allowable current value on the basis of a product of the parameter representing the temporal change in the polarization voltage and the polarization voltage calculated,
calculate a second allowable current value based on a difference between the allowable current value and the maximum current value, and
control the battery such that the second allowable current value is output for a predetermined time.

6. The battery pack according to claim 5,
wherein the memory stores a battery internal resistance predicted after causing a constant current to flow from a non-polarization state for a predetermined time.

7. The battery pack according to claim 6,
wherein the processor calculates a polarization voltage after elapse of a predetermined time on the basis of the present polarization voltage and the parameter representing the temporal change of the polarization voltage.

8. The battery pack according to claim 7,
wherein the processor calculates the corrected value of the allowable current value on the basis of the polarization voltage after elapse of the predetermined time and the battery internal resistance predicted after causing the constant current to flow from the non-polarization state for the predetermined time.

* * * * *